United States Patent [19]

Malladi et al.

[11] Patent Number: 5,972,736
[45] Date of Patent: Oct. 26, 1999

[54] INTEGRATED CIRCUIT PACKAGE AND METHOD

[75] Inventors: Deviprasad Malladi, Campbell; Mario J. Lee, Santa Clara; Ehsan Ettehadieh, Albany; Nagaraj Mitty, San Jose, all of Calif.

[73] Assignee: Sun Microsystems, Inc., Mountain View, Calif.

[21] Appl. No.: 09/205,424

[22] Filed: Dec. 4, 1998

Related U.S. Application Data

[62] Division of application No. 08/959,957, Oct. 24, 1997, which is a continuation of application No. 08/661,859, Jun. 11, 1996, abandoned, which is a continuation of application No. 08/361,145, Dec. 21, 1994, abandoned.

[51] Int. Cl.⁶ .......................... H01L 21/44; H01L 21/48; H01L 21/50
[52] U.S. Cl. .................. 438/118; 438/112; 438/122; 257/675; 257/676; 257/707; 257/783
[58] Field of Search ...................... 438/112, 118, 438/122, 124, 127, 126; 257/675, 676, 687, 707, 713, 783

[56] References Cited

U.S. PATENT DOCUMENTS

| | | | |
|---|---|---|---|
| 4,698,662 | 10/1987 | Young et al. | 357/80 |
| 4,876,588 | 10/1989 | Miyamoto | 357/81 |
| 4,926,242 | 5/1990 | Itoh et al. | 357/81 |
| 5,012,386 | 4/1991 | McShane et al. | 361/386 |
| 5,109,317 | 4/1992 | Miyamoto et al. | 361/386 |
| 5,198,889 | 3/1993 | Hisano et al. | 257/678 |
| 5,345,107 | 9/1994 | Daikoku et al. | 257/717 |
| 5,362,680 | 11/1994 | Heinen | 156/245 |
| 5,367,193 | 11/1994 | Malladi | 257/707 |
| 5,404,273 | 4/1995 | Akagawa | 361/707 |
| 5,672,548 | 9/1997 | Culnane | 438/118 |

FOREIGN PATENT DOCUMENTS

| | | |
|---|---|---|
| 63-81956 | 4/1988 | Japan . |
| 63-182844 | 7/1988 | Japan . |
| 3-212961 | 9/1991 | Japan . |

OTHER PUBLICATIONS

"Electronic Packaging & Interconnection Handbook" by Charles A. Harper, Dated Nov. 3, 1992, Published by: McGraw–Hill, Inc. Subject: Hybrid Microelectronic Packaging.

*Primary Examiner*—Charles Bowers
*Assistant Examiner*—Nema Berezny
*Attorney, Agent, or Firm*—Flehr Hohbach Test Albritton & Herbert; Steven F. Caserza

[57] ABSTRACT

An integrated circuit package with heat slug is disclosed. The heat slug is thermally coupled to one or more semiconductor die using a single layer of high conductivity adhesive. The assembly process of this invention includes the steps of initially attaching a temporary heat slug to the back side of a package body, to which one or more semiconductor die are attached. The semiconductor die are then electrically connected to the package body and encapsulated to maintain fixed positions within the package cavity. The temporary heat slug is then moved and a final heat slug is attached to the package body and the back side of the one or more semiconductor dies utilizing a single layer of high conductivity adhesive. The package is compact, has reduced complexity, and is inexpensive to manufacture.

8 Claims, 2 Drawing Sheets

INTEGRATED CIRCUIT PACKAGE AND METHOD

This application is a divisional application of U.S. Ser. No. 08/959,957; filed Oct. 24, 1997; which is a continuation application of U.S. Ser. No. 08/661,859 now abandoned; filed Jun. 11, 1996; which is a file wrapper continuation application of U.S. Ser. No. 08/361,145 now abandoned; filed Dec. 21, 1994.

FIELD OF THE INVENTION

This invention relates generally to the packaging of integrated circuits. More particularly, this invention relates to a low-cost integrated circuit package with an integral heat exchanger and efficient thermal dissipation path, and the method for making the same.

DESCRIPTION OF PRIOR ART

The evolution of integrated circuit technology continues to increase transistor speed and density. Specifically, advances in integrated circuit fabrication technology have resulted in chips with high clock speeds, high levels of integration, high power consumption, large numbers of inputs and outputs, and large dies. All of the factors have increased the need for packages with efficient thermal dissipation in order to maintain acceptable junction temperatures for chip speed and reliability. Maintaining a low junction temperature, less than 100° C. for typical chips, is necessary for high performance and reliability. The operating speed of an integrated circuit is inversely proportional to the die temperature. As the temperature increases, carrier mobility decreases, causing transistors to slow down. In addition, as metal resistance rises with temperature, interconnect delays increase. Static leakage currents also increase with temperature. Common reliability problems like electromigration, oxide breakdown and hot electron effects are more severe at higher temperatures.

In a typical package, a thermal dissipation path starts at the semiconductor die, goes through the die attach material, heat slug, heat sink attach interface, and finally through the heat sink which transfers heat to the ambient air. A secondary thermal dissipation path exists through the package pins. Each element along a thermal dissipation path has a corresponding thermal resistance. It is desirable to reduce the number of elements along a thermal dissipation path. It is especially desirable to eliminate high thermal resistance elements from a thermal dissipation path.

FIG. 1 shows a typical prior art integrated circuit package 20. Package 20 includes housing 22 commonly formed of a plastic or a ceramic material. Fitted within the base of housing 22 is heat slug 24. Die attach interface 26 connects heat slug 24 to integrated circuit die 28. Bond wires 30 electrically connect integrated circuit die 28 to housing 22. Electrical signals from bond wires 30 are transferred to the outside of package 20 through package pins 32. Package 20 also includes heat sink attach interface 34 to connect heat slug 24 to heat sink 36.

In the apparatus of FIG. 1, heat slug 24 and heat sink 36 provide excellent thermal dissipation. On the other hand, die attach interface 26 and heat sink attach interface 34 constitute relatively high thermal resistance elements. It would be highly desirable to provide an integrated circuit package that eliminates at least one of these relatively high thermal resistance elements.

FIG. 2 is another prior art integrated circuit package which is suitable for surface mounting. Package 40 includes housing 22 including conductor traces (not shown) terminating in pads to which solder balls 42 are placed, suitable for surface mounting on a printed circuit board or other type substrate. Package 40 includes heat slug 46 attached to body 22 with an adhesive 34, such as a softening adhesive such as an epoxy having a low softening temperature (e.g. 150–200° C.). Integrated circuit die 28 is attached to heat slug 46 utilizing a layer of die attach material (not shown). This prior art package has a disadvantage in that semiconductor die 28 is attached to heat slug 46 through the die attach adhesive and, if a heat sink is to be attached to heat slug 46, an additional adhesive is used, adding to the thermal resistance between semiconductor die 28 and the heat sink.

Instead of relying upon heat sink 36 of FIG. 1 or heat slug 46 of FIG. 2, it is known in the art to use a liquid cooling device. Integrated circuit packages that utilize liquid cooling devices tend to be complex structures that are expensive to manufacture. For example, liquid cooling devices may be of the type that have fluid channels in a heat exchanger that is attached to the integrated circuit package or they may rely upon elaborate bellows devices for interfacing with the integrated circuit package. Other types of liquid cooling schemes include immersing the integrated circuits themselves in a cooling fluid, the use of thermosiphons, and the use of heat pipes. Each of these approaches results in a bulky device that is difficult and expensive to manufacture. It would be highly desirable to provide a compact liquid cooled integrated circuit package of reduced complexity that is inexpensive to manufacture.

SUMMARY

The invention is an integrated circuit package with an integral heat exchanger which is more directly thermally coupled to the semiconductor die. The package is assembled including a heat slug or other attaching mechanism which is attached to the package body with a low temperature softening material which can withstand temperatures encountered during normal assembly operations, and which will soften at a temperature not much higher.

The semiconductor die is attached to this heat slug in a cavity of the package body, and bond wires are connected between bond pads on the semiconductor die and electrical interconnects on the package. Solder balls are formed either before or after die attach and/or wire bonding or encapsulation. The semiconductor die, once wire bonded, is encapsulated utilizing a suitable encapsulating material. The heat slug is then removed utilizing a temperature higher than normally utilized during assembly but lower than the temperature which will cause damage to the thus far assembled package. The back side of the semiconductor die is thus exposed, and if desired is cleaned chemically or mechanically to provide a good thermal surface to which a heat sink or other thermal dissipation element is attached.

BRIEF DESCRIPTION OF THE DRAWINGS

For a better understanding of the nature and objects of the invention, reference should be made to the following detailed description taken in conjunction with the accompanying drawings, in which.

DETAILED DESCRIPTION

Figure 3A:
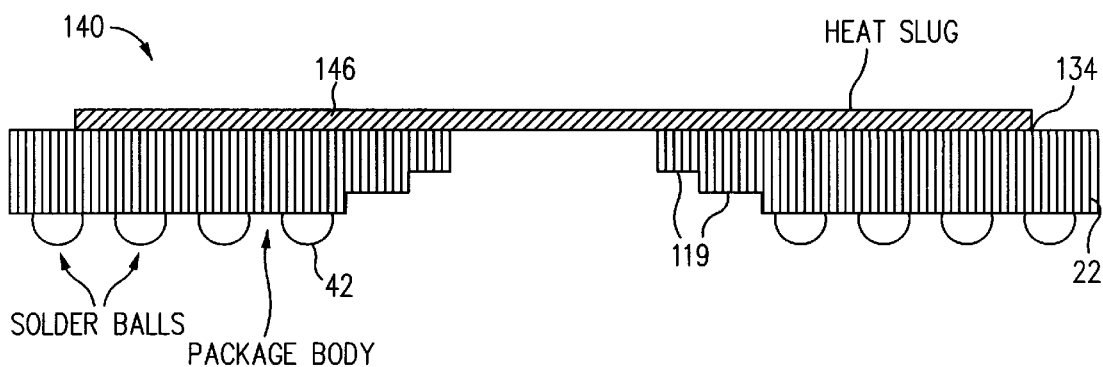
FIGS. 3a–3e are cross sectional views of one embodiment of the invention, as it is assembled.

Referring to FIGS. 3a–3e, an exemplary process of this invention is illustrated, together with the resulting structures. As shown in FIG. 3a, package body 22 includes one or more land areas 119 having exposed electrical pads for wire bonding between a semiconductor die (not shown) and those land areas. The land areas are connected by a conductive pattern to areas to which solder balls 42 are affixed, allowing for the later surface mounting of the completed device to a printed circuit board or other substrate. In this embodiment, solder balls 42 are shown affixed to package body 22 at an initial stage of the assembly process, although it is to be understood that solder balls 42 can, if desired, be formed at appropriate locations in a well known manner at any desired step in the assembly process.

Attached to package body 22 is heat slug 146, or any other suitable attaching mechanism. Suitable materials for attaching mechanism 146 include copper, aluminum, alloys thereof, and various plastics. Attaching mechanism 146 is attached to package body 22 by a low softening temperature adhesive 134, such as epoxy or polyurethane, polyphenylene oxide or any thermo plastic material with melting point less than about 200° C., which can withstand temperature encountered during normal assembly operations, for example up to approximately 150–200° C.

Figure 3B:
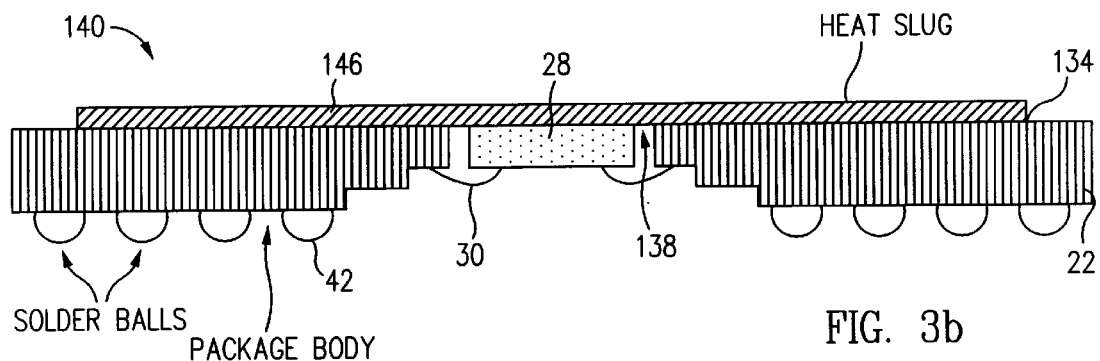

Referring to FIG. 3b, the next step in the assembly process is the die attach operation, by which semiconductor die 28 is attached to attaching mechanism 146 utilizing die attach adhesive 138 which is applied at a temperature not exceeding the softening temperature of low temperature softening adhesive 134. Typical die attach adhesives include epoxy, polyamide, metal filled polymer, a ceramic filled polymer, a diamond filled polymer, silver glass, solder, braze alloy, or activated nitride films. Note that while it is stated that temperatures do not exceed the softening temperatures of the adhesive used to attach mechanism 146 to the package body, it is of course to be understood that this means during the brief period of time during which the die attach operation takes place, as the entire body and attaching mechanism may not fully heat up during this short time period.

As shown in FIG. 3b, once semiconductor die 28 is attached, wire bonding is performed so that a plurality of wire bonds 30 are formed between the electrical interconnects on package body 22 and bond pads on semiconductor die 28.

Figure 3C:
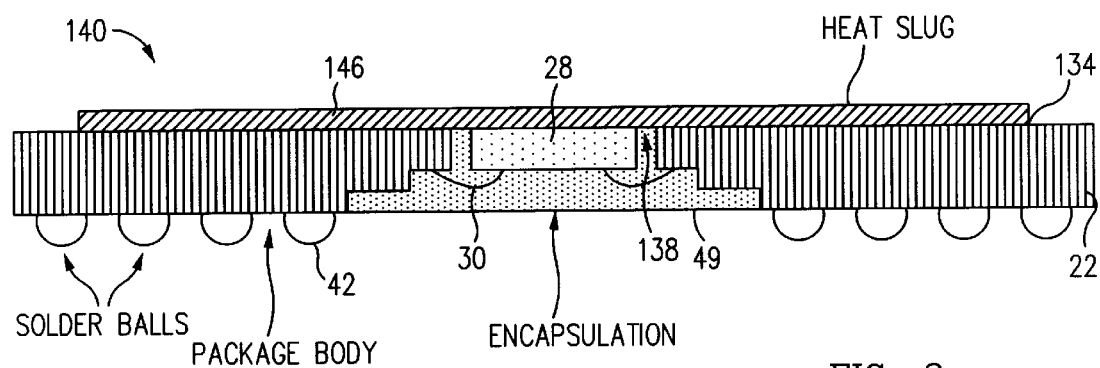
Figure 3D:
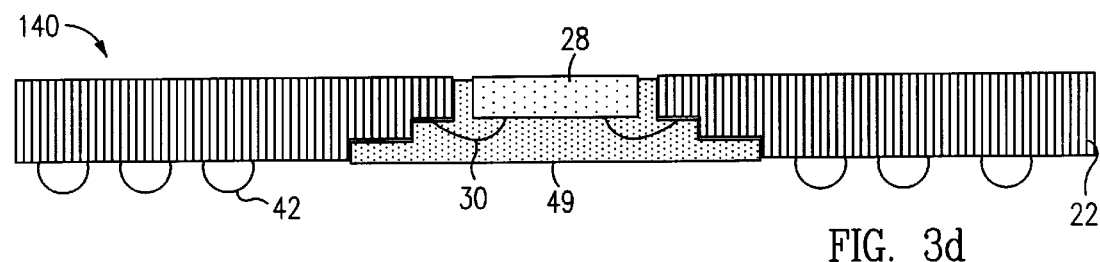

Referring to FIG. 3c, semiconductor die 28 and bond wires 30 are now encapsulated by applying a suitable encapsulating material 49, such as an epoxy, as is well known. In one embodiment, this epoxy does not soften at the softening temperatures of low softening temperature adhesive 134, although this need not be necessary as only a small amount of heat is transferred to encapsulating material 49 when attaching mechanism 146 is later removed. This encapsulation material 49 serves to protect semiconductor die 28 and bond wires 30 and also serves to attach semiconductor die 28 to package body 22 during the next step of this invention during which attaching mechanism 146 is removed, as shown in FIG. 3d.

Attaching mechanism 146 is removed by increasing the temperature of the structure above the temperature at which low temperature softening material 134 (FIG. 3c) softens, allowing attaching mechanism 146 to be easily removed from package body 22 without disturbing semiconductor die 28 which is held in place by encapsulation material 49. In one embodiment, since this temperature at which low temperature softening material 134 softens is above the softening temperature of die attach adhesive 138, a good portion of die attach adhesive 138 is removed at this time as well. If desired, a suitable mechanical or chemical cleaning of the backside of semiconductor die 28 and, if desired, the backside of package body 22 is now performed to improve the cleanliness and thus thermal conductivity of those portions of the structure. In one embodiment, such mechanical cleaning is accomplished by scraping or lapping. In another embodiment, as an alternative or in addition to such mechanical cleaning, chemical cleaning of those areas.

Figure 3E:
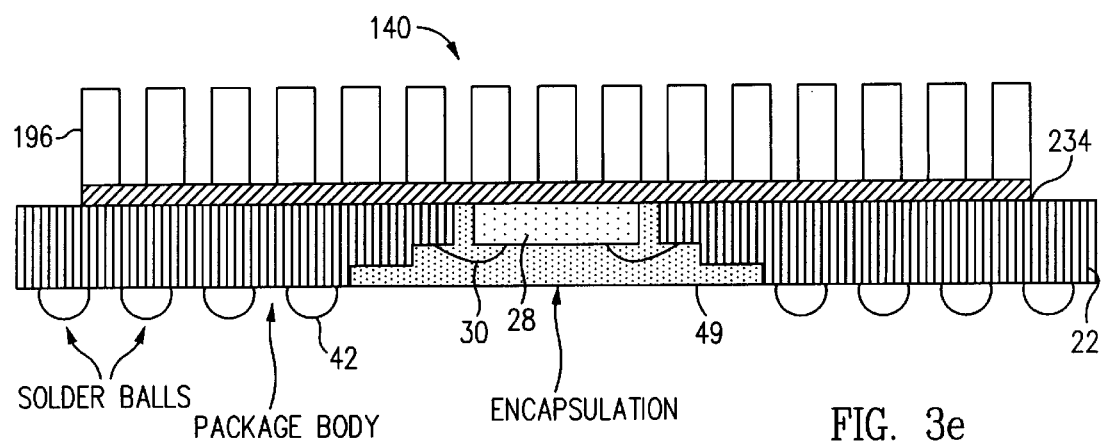

As shown in FIG. 3e, heat sink 196 is now attached to the backside of semiconductor die 28 and package body 22 utilizing a single layer of adhesive 234, which preferably has as high a thermal conductivity as practical. In one embodiment of this invention, adhesive 234 comprises epoxy or polyurethane, polyphenylene oxide or any thermo plastic material with melting point less than about 200° C. In an alternative embodiment, a thermal grease is used, with mechanical clamps holding heat sink 196 in close fixed contact with package body 22.

While this embodiment has been described with respect to a single semiconductor die 28 electrically connected to portions of package body 22 by bond wires 30, it will be appreciated by those of ordinary skill in the art in light of the teachings of this specification that a plurality of semiconductor die 28 can be used in place of a single semiconductor die as shown in FIGS. 3a through 3e, thereby forming a multi-chip module. Furthermore, such bond wires 30 associated with either a single or a plurality of semiconductor dies can be replaced with any of a number of well known electrical interconnect techniques, including tape automated boding (TAB) or the like.

Package body 22 of the invention may be formed of any of the usual materials used for this purpose, such as alumina, glass-ceramic, and polymers with appropriate metal interconnection layers. Heat sink 196 may be formed of copper, dispersion hardened copper, alumina, copper-tungsten, copper-molybdenum, or copper-diamond.

Figure 1:
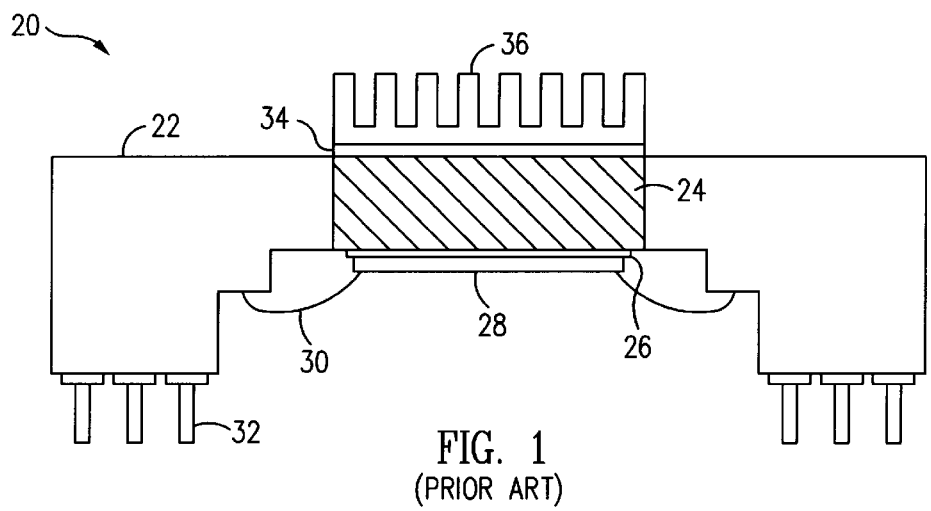
FIG. 1 is a prior art integrated circuit package with a finned heat sink.
Figure 2:
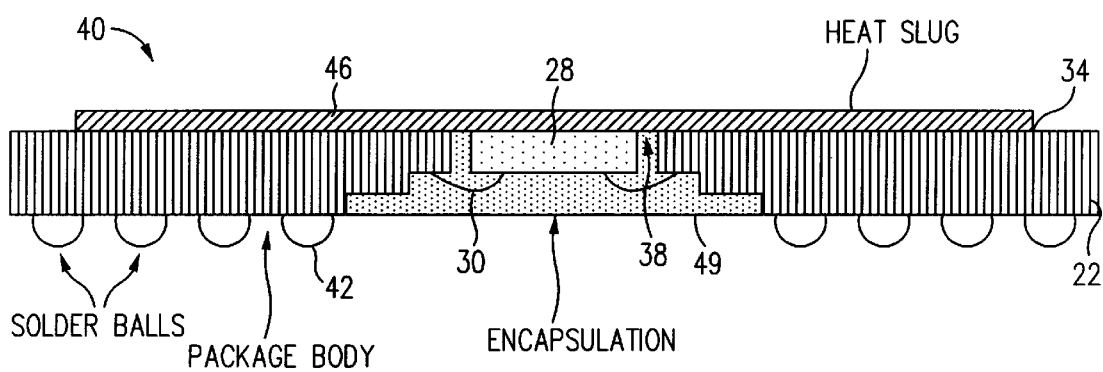
FIG. 2 is another prior art integrated circuit package with an integral heat slug and solder balls for surface mounting.

Those skilled in the art will recognize a number of benefits associated with the apparatus of FIGS. 3a–3e. First, it eliminates one thermal interface from the cooling path. That is, prior art use of heat slug adhesive 34 and die attach adhesive 38 (FIG. 2) are replaced by a single layer of high thermal conductivity adhesive 234 (FIG. 3e).

Another advantage associated with the invention is that standard packaging fabrication techniques may be used. Thus, the apparatus of the invention is relatively easy to manufacture.

In accordance with the teachings of this invention, semiconductor die 28 is maintained such that its backside is at the same level as the backside of package body 22, allowing heat sink 196 to be attached to the backside of package body 22 and the backside of semiconductor die 28, which are at substantially the same level, in a fashion which distributes stresses substantially evenly. This minimizes the thickness of adhesive 234 which must exist between semiconductor die 28 and heat sink 196. It has been determined that the thermal resistance between semiconductor die 28 and heat sink 196 is reduced on the order of 0.5° C./watt as compared with the prior art structures of FIG. 2. This means that for a semiconductor die 28 operating at a power dissipation of 30 watts, semiconductor die 28 is able to run 15° C. cooler than possible utilizing the prior art of FIG. 2.

As an additional advantage of this invention, the structure of this invention is capable of being fully assembled, including wire bonding and the like, and later attached to physical large heat sinks which are capable of dissipating a significant amount of heat. This is a distinct advantage over the prior art where large heat sinks cannot be utilized by their attachment at an early stage during the process, as a package with such a large heat sink cannot be properly or reliably placed in a wire bond machine.

The foregoing descriptions of specific embodiments of the present invention are presented for purposes of illustration and description. They are not intended to be exhaustive or to limit the invention to the precise forms disclosed, obviously many modifications and variations are possible in view of the above teachings. For instance, it should be appreciated that the present invention can also be used in a liquid cooling context, such as is described in copending U.S. patent application Ser. No. 08/282,985, filed Jul. 29, 1994. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. A method for making a semiconductor device comprising the steps of:

attaching one or more semiconductor dies, within a cavity of a package body, to an attaching mechanism which is attached to the back of said package body;

placing bond wires between said one or more semiconductor dies and said package body;

applying an adhesive within said cavity to mechanically attach said one or more semiconductor dies to said package body;

removing said attaching mechanism from said back of said package body and the back of said one or more semiconductor dies; and attaching a heat sink to said package body and in substantial contact with said back of said one or more semiconductor dies.

2. A method as in claim 1 wherein said step of attaching said one or more semiconductor dies comprises the step of attaching with a material selected from the group of materials including: epoxy and polyurethane die attach adhesives.

3. A method as in claim 1 wherein said step of removing said attaching mechanism comprises the step of heating to a temperature sufficiently high to soften an adhesive between said package body and said attaching mechanism.

4. A method as in claim 3 wherein said temperature is not sufficiently high to disturb said adhesive within said cavity.

5. A method as in claim 3 wherein said adhesive between said package body and said attaching mechanism comprises a material selected from the group consisting essentially of epoxy, polyurethane, polyphenylene oxide and any thermoplastic material with melting point less than about 200° C.

6. A method as in claim 3 wherein said temperature is within the range of approximately 150–200° C.

7. A method as in claim 1 which further comprises the step of, prior to attaching said heat sink, cleaning said back of said package body and said back of said one or more semiconductor dies.

8. A method as in claim 7 wherein said step of cleaning comprises a mechanical or chemical cleaning.

* * * * *